(12) United States Patent
Deppiesse et al.

(10) Patent No.: US 8,368,505 B2
(45) Date of Patent: Feb. 5, 2013

(54) SWITCH USING VARIABLE RESISTANCE LAYER TO CONTROL STATE

(75) Inventors: Robert W. Deppiesse, Bothell, WA (US); Alan M. Burk, Kirkland, WA (US)

(73) Assignee: Almax Manufacturing Corporation, Kirkland, WA (US)

( * ) Notice: Subject to any disclaimer, the term of this patent is extended or adjusted under 35 U.S.C. 154(b) by 293 days.

(21) Appl. No.: 12/723,377

(22) Filed: Mar. 12, 2010

(65) Prior Publication Data

US 2011/0221564 A1 Sep. 15, 2011

(51) Int. Cl.
*H01C 10/10* (2006.01)
(52) U.S. Cl. ............................. 338/99; 338/47; 338/114
(58) Field of Classification Search .............. 338/47, 338/99, 114; 200/511–512
See application file for complete search history.

(56) References Cited

U.S. PATENT DOCUMENTS

| | | | |
|---|---|---|---|
| 4,745,301 A | 5/1988 | Michalchik | 307/119 |
| 4,790,968 A | 12/1988 | Ohkawa et al. | 264/104 |
| 5,060,527 A * | 10/1991 | Burgess | 73/862.68 |
| 5,132,583 A * | 7/1992 | Chang | 310/339 |
| 5,689,285 A | 11/1997 | Asher | 345/161 |
| 5,695,859 A | 12/1997 | Burgess | 428/209 |
| 6,121,869 A | 9/2000 | Burgess | 338/99 |
| 6,307,169 B1 | 10/2001 | Sun et al. | 200/181 |
| 6,329,617 B1 | 12/2001 | Burgess | 200/61.43 |
| 7,145,432 B2 * | 12/2006 | Lussey et al. | 338/47 |
| 7,439,465 B2 | 10/2008 | Parkinson | 200/512 |
| 7,772,960 B2 * | 8/2010 | Baker | 338/99 |

* cited by examiner

*Primary Examiner* — Kyung Lee
(74) *Attorney, Agent, or Firm* — Lee & Hayes, PLLC

(57) ABSTRACT

An electrical membrane switch that is actuated by applying a force against a layer of a variable resistance material that overlies and is in direct contact with switch poles that are applied to and supported by a substrate. A gap is provided between the switch poles, and the layer extends across the gap. The substrate can be a circuit board with electrical traces formed thereon to convey electrical current to the switch poles. As a sufficient force is applied to the surface of the layer of the variable resistance material, its resistance changes from a relatively high value, in which the switch is in a non-conducting state, to a relatively low value, in which the switch is in a conductive state. A protective sheet can optionally be included over the variable resistance layer and can include graphics/text to indicate the position of each switch in an array and its function.

25 Claims, 6 Drawing Sheets

SWITCH USING VARIABLE RESISTANCE LAYER TO CONTROL STATE

BACKGROUND

Simple electrical switches typically include an electrically conducting movable element that is coupled to one pole of the switch and which is selectively repositioned to contact another pole of the switch, thereby providing a current path between the two poles, changing the switch from an open state to a closed state. However, this type of mechanical switch requires relatively more space to implement than is often available in many applications and is typically more expensive to manufacture than desired. For example, a keypad used on electrical appliances is typically less than 1 mm thick and can include an array of switches that are each selectively actuated by pressing against an indicated position on the keypad, for example, with the tip of a finger. For such applications, a membrane switch is preferably used, since it can be implemented in a limited depth available for the keypad.

Some membrane switches include electrical contacts or poles attached to a substrate for each switch. A shorting conductive layer overlying the poles of each switch is biased away from the poles and the substrate. When a user presses against a flexible surface supporting the shorting conductive layer, the shorting conductive layer is forced into contact with the poles, changing the switch from an open or non-conducting state to a closed or conducting state.

An example of another type of membrane switch 10, is shown in FIG. 1. Membrane switch 10 includes two substrates 12 and 14 that are planar and generally parallel to each other, but spaced apart. Two switch contacts or switch poles 16 and 18 are formed on substrate 12 and are spaced apart from each other by a gap 20. Poles 16 and 18 can be formed, for example, as the fingers of interdigital electrodes that are plated on substrate 12. A spacer layer 22 is provided around and partially overlying poles 16 and 18. A shorting pad 24 is printed on the undersurface of top flexible layer 14, immediately opposite, but spaced apart from switch poles 16 and 18 by spacer layer 22.

As shown in FIG. 1, prior art membrane switch 10 is in its open or non-conducting state, since shorting pad 24 is not in contact with switch poles 16 and 18. However, if a user applies a force against the upper surface of top flexible layer 14, for example, by pressing with a fingertip, top flexible layer 14 is deflected downwardly by the applied force, causing shorting pad 24 to contact switch poles 16 and 18. The shorting pad then carries an electrical current between switch poles 16 and 18 and membrane switch 10 is in its closed or conducting state.

While membrane switch 10 is very useful in many applications, it has a higher cost than may be desired, because it requires two substrates—substrate 12 on which poles 16 and 18 are applied, and top flexible layer 14 on which shorting pad 24 is applied. Also, since substrate 12 must be separated by spacer layer 22 from top flexible layer 14 to prevent shorting pad 24 from inadvertently contacting the switch poles, this prior art switch must be thicker than is sometimes desired.

To reduce the cost of a membrane switch like that described above, it would be desirable to provide a membrane switch that includes only a single substrate and does not require a top flexible layer as a carrier for a shorting pad. Also, it would be desirable to provide a membrane switch that is thinner in profile (less depth) and responds to an applied force to change the state of the switch more rapidly because there are no moving parts—even without deflecting a substrate to move a shorting pad into contact with electrical switch poles, as in membrane switch 10. It would also be desirable to provide a membrane switch in which the resistance between switch contacts varies as a function of the force applied to the switch. For certain applications, such a switch should enable each of a plurality of switches to be successively activated as a force is applied and swept along a protective sheet overlying the switches. The plurality of switches can be arrayed either linearly or in an arc, i.e., as a rotary membrane switch. It would also be desirable to provide such a switch that should be more durable, since it would have no moving parts.

SUMMARY

An electrical switch of the membrane type has been developed that includes only one substrate. A plurality of electrical poles are supported by the substrate, and a layer of a variable resistance material is in contact with the plurality of electrical poles. An electrical resistance of the layer of the variable resistance material to electrical current flow between the plurality of electrical poles varies as a function of a force applied against the layer of the variable resistance material in a direction generally transverse to the layer.

The resistance of the layer of the variable resistance material is variable over a range sufficient to substantially block electrical current flow between the plurality of electrical poles through the layer when a force is not applied because the resistance of the variable resistance material is then relatively high. However, when a force is applied to the layer having a sufficient magnitude, the variable resistance material conducts an electrical current with minimal resistance. Accordingly, in at least one exemplary embodiment, the electrical switch is either in an open state (i.e., a substantially non-conducting state) when the resistance is relatively high, or in a closed state (i.e., a substantially conducting state) when the resistance is relatively low.

In at least one exemplary embodiment, the electrical switch also includes a layer of a conductive material that is in contact with a side of the layer of the variable resistance material opposite a side in contact with the plurality of electrical poles. When the force is applied to the layer of the variable resistance material, the electrical current flows from at least one of the electrical poles vertically, (e.g., along a z-axis) through the layer of variable resistance material, transversely (e.g., along an x-axis) through the layer of the conductive material, and then again vertically (but in an opposite direction) through the layer of variable resistance material to at least one other switch pole.

The variable resistance material can be chosen so that its resistance to electrical current flow varies in a generally linear manner over a range of force that is readily achieved by a user. For example, a user can apply force to the switch with a fingertip to actuate the switch. In this embodiment, the electrical switch can function like a potentiometer to vary the current flow through the electrical switch as a function of the force applied to the layer of the variable resistance material.

Optionally, a protective sheet can be disposed over the layer of the variable resistance material. This protective sheet can be selected and configured so that a force applied to the protective sheet is readily transmitted to the layer of the variable resistance material. The protective sheet can further optionally include graphics, which at least indicate a region where the force should be applied to activate the electrical switch. As a further option, the graphics on the protective sheet can indicate a function of the electrical switch. The term "graphics" as used herein is intended to broadly encompass any shapes, symbols, colored areas, lines, alphanumeric text, and other types of indicia that can indicate a location or functionality.

The plurality of electrical poles can comprise regions formed in a conductive layer that is applied to the substrate. For example, these regions can be formed as interdigital electrodes that are interspersed and separated by gaps on the single substrate. In addition, the electrical switch can include electrically conducting traces disposed on the substrate and electrically coupled to the electrical poles.

In at least one embodiment, the electrical poles comprise a plurality of electrical switch circuits. Each electrical switch circuit can be separately controlled to change between an open state (i.e., a non-conducting state) and a closed state (i.e., a conducting state) as a function of a force applied to a portion of the layer of the variable resistance material that is disposed over the electrical switch circuit. The plurality of electrical switch circuits can be linearly arrayed, enabling successive electrical switch circuits to be changed from the open state, to the closed state, and back to the open state, as a location at which the force applied to the layer of the variable resistive material is moved over the plurality of electrical switch circuits in succession. The plurality of electrical switch circuits can be configured in either a one-dimensional or a two-dimensional array, so that each electrical switch circuit can be selectively activated to change to the closed state by applying a force to the portion of the layer of the variable resistance material that overlies that electrical switch circuit.

In at least one exemplary embodiment, the variable resistance material has an electrical resistance that varies from about 1 megohm in the open state to about 100 ohms in the closed state. The layer of the variable resistance material can be applied over the electrical poles in a desired configuration defining a specific shaped region.

This Summary has been provided to introduce a few concepts in a simplified form that are further described in detail below in the Description. However, this Summary is not intended to identify key or essential features of the claimed subject matter, nor is it intended to be used as an aid in determining the scope of the claimed subject matter.

DRAWINGS

Various aspects and attendant advantages of one or more exemplary embodiments and modifications thereto will become more readily appreciated as the same becomes better understood by reference to the following detailed description, when taken in conjunction with the accompanying drawings, wherein:

FIG. 1 (Prior Art) is a side elevational view of a generally conventional membrane switch that includes two substrates, a plurality of switch poles being formed on one of the substrates, and a shorting pad being applied on another conductive substrate, overlying the switch poles and separated from them by circuit spacers;

FIG. 2 is a side elevational view of an exemplary embodiment of a membrane switch in accord with the present approach, wherein the membrane switch includes a single substrate on which electrical poles are formed, a layer of variable resistance material overlying and directly in contact with the electrical poles, and an optional protective sheet, which can also optionally be provided with appropriate graphics and/or text;

Figure 10:
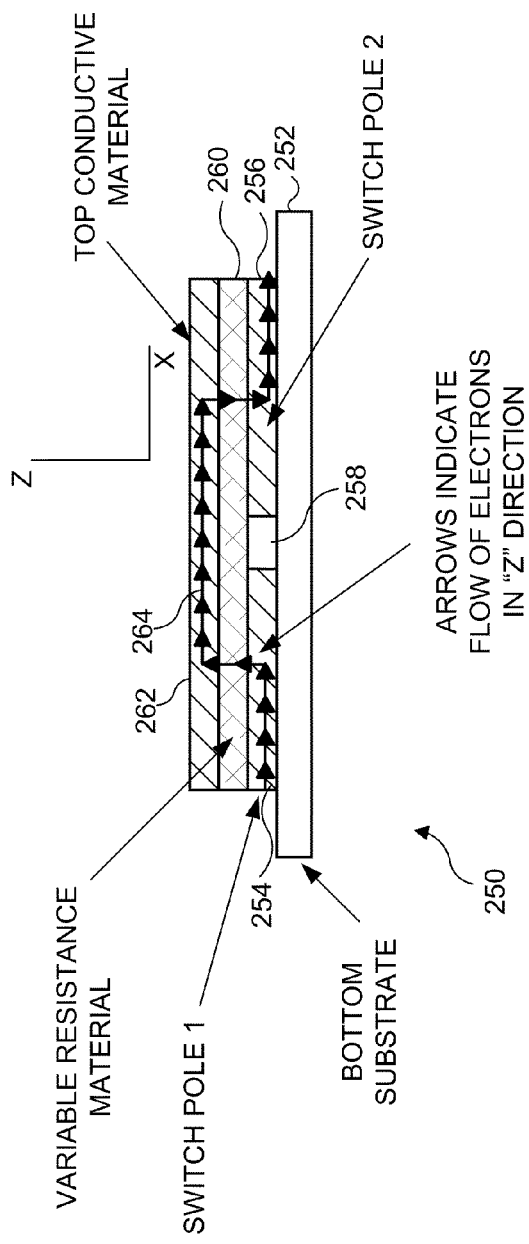
Figure 11:
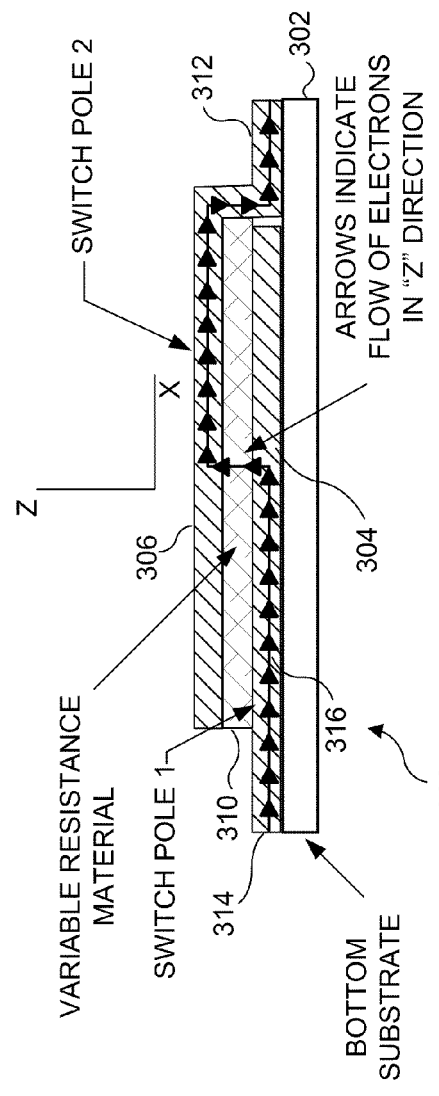

FIG. 10 is a schematic side cross-sectional view of an alternative exemplary embodiment of a switch in which a layer of variable resistance material conducts an electrical current along a "z" axis (or vertically as shown in the Figure) between a switch pole and an overlying conductive material, when a vertical force (in the z direction) is applied to the switch over the switch poles; and FIG. 11 is a schematic side cross-sectional view of yet another alternative exemplary embodiment of a switch in which a layer of variable resistance material conducts an electrical current along a "z" axis (or vertically as shown in the Figure) between a switch pole applied to a substrate, and an overlying switch pole that is applied over the layer of variable resistance material, when a vertical force (in the z direction) is applied to the switch at the switch poles.

DESCRIPTION

Figures and Disclosed Embodiments are not Limiting

Exemplary embodiments are illustrated in referenced Figures of the drawings. It is intended that the embodiments and Figures disclosed herein are to be considered illustrative rather than restrictive. No limitation on the scope of the technology and of the claims that follow is to be imputed to the examples shown in the drawings and discussed herein.

Exemplary Membrane Switch with Variable Resistance Layer

Figure 1:
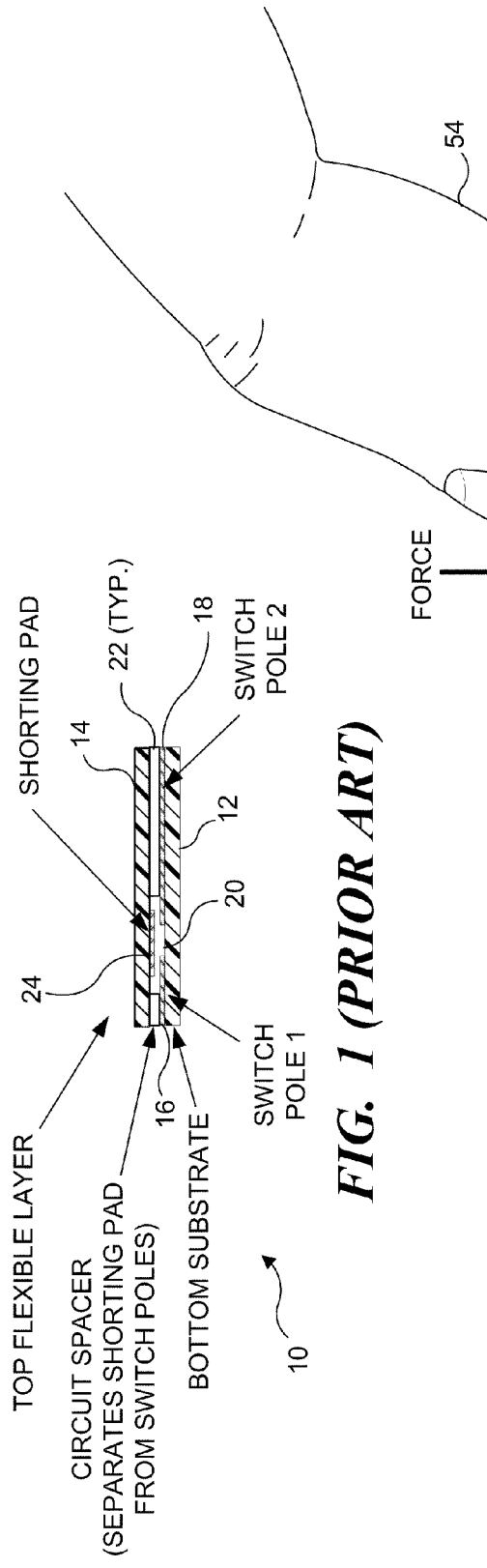
Figure 2:
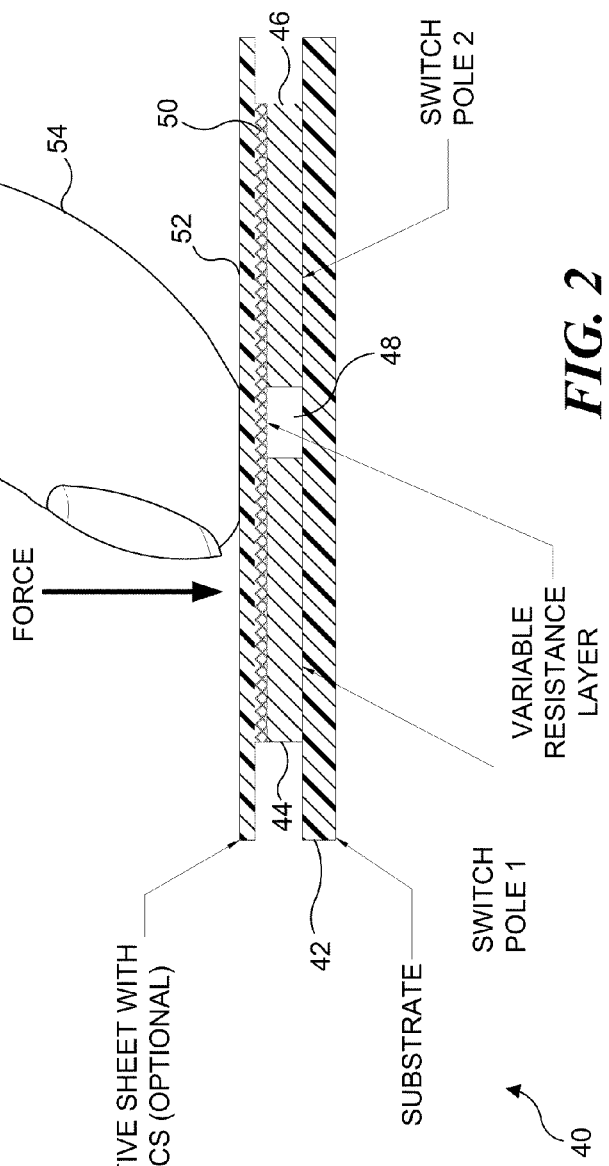

An exemplary embodiment of a membrane switch 40 shown in FIG. 2 includes a substrate 42 of a non-conductive material. For example, substrate 42 can be fabricated from glass fiber-reinforced epoxy resin (Fiberglass™), or from paper-reinforced phenolic resin, or from polyethylene terephthalate (PET) or some other type of thermoplastic polymer resin. Also, conventional techniques such as plating or etching away copper (or other conductive material), or printing a conductive material can be used for forming electrically conductive switch poles 44 and 46 on substrate 42, in a desired shape and configuration. The switch poles are formed so that they are separated by a gap 48. For example, poles 44 and 46 can formed as interdigital fingers that are interlaced and separated by gap 48, or can be formed in other desired configurations, as discussed below in connection with other exemplary embodiments.

A variable resistance layer 50 is applied directly over and in contact with switch poles 44 and 46. This layer can be applied as an ink that is printed or otherwise applied using techniques that are well known to those of ordinary skill in the art, in a desired form (e.g., rectangular, square, round, or other shape) onto the switch poles so that it covers the switch poles, or can be adhered using other appropriate techniques that deposit or apply the variable resistance material as a thin layer on the exposed surfaces of switch poles 44 and 46 and bridging over gap 48. The material used for the variable resistance layer in this and other exemplary embodiments discussed below is selected to provide a desired range of resistance, where the resistance of the material to electrical current varies as a function of a force applied in a direction generally perpendicular to the surface of the variable resistance layer. The components and process used for producing a material suitable for the variable resistance layer are well known in the art, as will be evident from the disclosure of U.S. Pat. No. 4,745, 301, among other patent and non-patent resources of such information. However, it is also contemplated that other suitable variable resistance layer materials will be developed, and it is not intended that the present approach in any way be limited to a specific variable resistance material. In at least one exemplary application, it is desirable that the resistance of the material used for variable resistance layer 50 be at least about 1 megohms when no force is applied to the variable resistance layer, and be at no more than about 100 ohms when a desired force (e.g., less than about 1 Newton) is applied in a direction perpendicular to the surface of the variable resistance layer. Since materials suitable for the variable resistance layer are well known in the art, they are not specifically disclosed herein.

Optionally, a protective sheet 52 (with any desired graphics) can be included to overlie variable resistance layer 50 and will serve to protect the material comprising the variable resistance layer from abrasion as a force is repetitively applied to the membrane switch to activate it. Protective sheet 52 can include graphics that indicate the location where the force should be applied to activate the membrane switch(es), as well as alphanumeric text and/or symbols to indicate the function implemented when membrane switch 40 is actuated.

Actuation of membrane switch 40 occurs in response to application of a force in a direction generally perpendicular to the variable resistance layer where it overlies switch poles 44 and 46. The force should have sufficient magnitude to change the variable resistance layer from an open or non-conductive state in which its resistance substantially blocks electrical current flow between switch poles 44 and 46, to a closed or conductive state, in which its resistance is reduced sufficiently to substantially enable an electrical current flow through the variable resistance layer, between switch poles 44 and 46. Protective sheet 52 can be fabricated from an appropriate material such as plastic or glass, and the optional graphics can be applied as a separate sheet (not specifically shown) or the graphic can be printed directly onto or incorporated integrally in the protective sheet. Since membrane switch 40 responds to pressure, the protective sheet does not have to be flexible, so long as it is able to transmit the force applied to a position on the variable resistance layer that overlies the switch poles. Thus, a thin sheet of plastic or glass can be employed for protective sheet 52, since a force applied against it, such as by a user's digit 54, will be transmitted to variable resistance layer 50—as shown in FIG. 2. There is minimal flexing of the protective sheet in response to application of the force required to change the membrane switch from a non-conducting to a conducting state.

Figure 3:
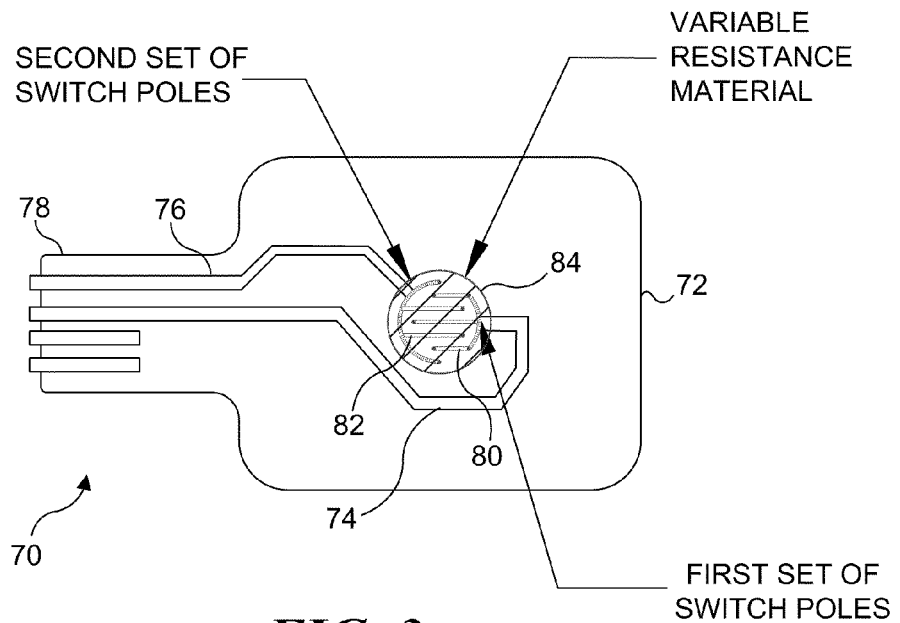
FIG. 3 is a plan view of the exemplary embodiment of FIG. 2, but omitting the optional protective sheet.

FIG. 3 illustrates a plan view of another exemplary embodiment of a membrane switch 70 (omitting any protective sheet). This embodiment includes a printed circuit board 72, which comprises the substrate for the membrane switch. Terminals 78 are disposed on one end of printed circuit board 72, and two of the terminals are coupled to electrically conductive traces 74 and 76. Terminals 78 are spaced apart and configured to couple to a terminal plug (not shown), but alternatively, can be configured to connect to external lead wires (not shown), for example, by using a solder connection.

Trace 74 is also connected to a first set of switch poles 80, which are formed as interdigital fingers. Similarly, trace 76 is connected to a second set of switch poles 82, which are formed as interdigital fingers that are interlaced with the interdigital fingers of first set of switch poles 80. A variable resistance layer 84 is applied over and directly on first and second sets of switch poles 80 and 82, so that when a force is applied in a direction generally perpendicular to the surface of the variable resistance layer, the resistance of the variable resistance layer is reduced, and with application of sufficient force, membrane switch 70 changes from a non-conducting state, to a conducting state. In the conducting state, an electrical current can readily be conveyed between first and second sets of switch poles 80 and 82, through the variable resistance layer.

Linear Array of Membrane Switches with Variable Resistance Layer

Figure 4:
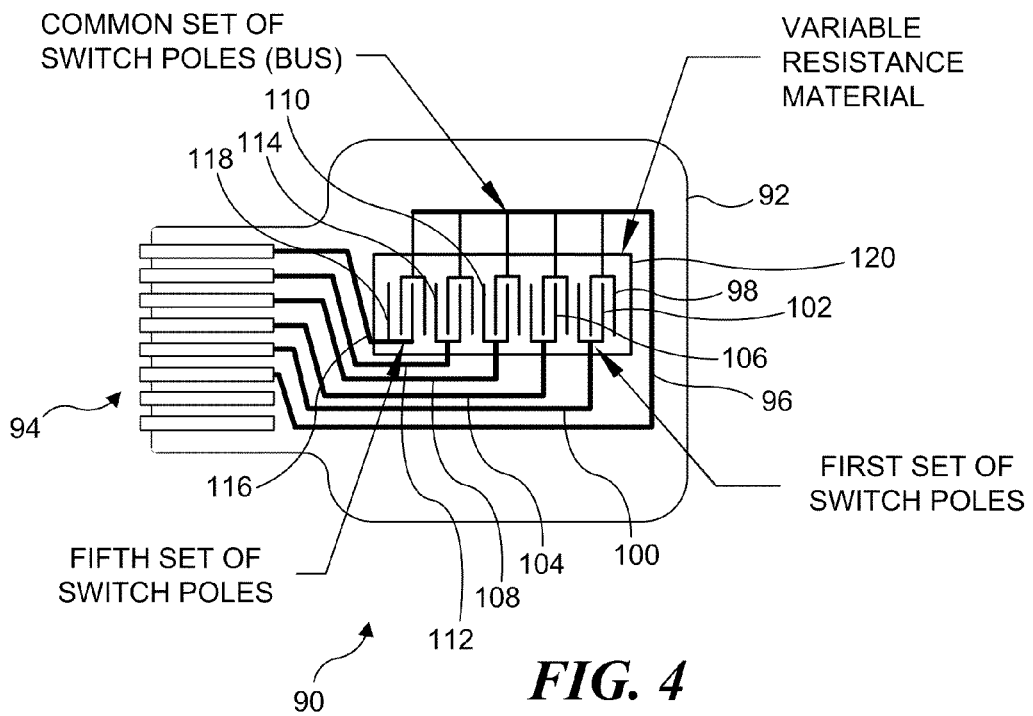
FIG. 4 is a plan view of another exemplary embodiment of a membrane switch having a plurality of switches successively disposed linearly along the substrate, so that they can be selectively activated in sequence by moving an applied force from side-to-side, or only a single desired one of the switches can be activated, by applying the force at the location of the desired switch.

FIG. 4 illustrates an exemplary embodiment of a linear array 90 of membrane switches on a printed circuit board 92, which serves as a substrate. Terminals 94 at one end of the printed circuit board are configured to be coupled with a terminal plug (not shown) and are connected to electrically conductive traces 96, 100, 104, 108, 112, and 116. Traces 96 connect to a common set of switch poles 98, which comprises interdigital fingers that are disposed in each of the plurality of linearly arrayed membrane switches and thus comprise a common bus. Interlaced with common set of switch poles 98 are interdigital fingers of first through fifth sets of switch poles 102, 106, 110, 114, and 118. The first through fifth sets of switch poles are respectively connected to traces 100, 104, 108, 112, and 116. Overlying and in direct contact with all of the sets of switch poles is a variable resistance layer 120, which can be applied as discussed above in connection with membrane switch 40 (FIG. 2). Not shown is an optional protective sheet that can include graphics indicating the location of the successive membrane switches comprising linear array 90, and can also indicate a function implemented by the linear array. As a sufficient force is applied to variable resistance layer 120 in a direction generally perpendicular to the surface of this layer and at a position over any of the membrane switches, the membrane switch changes from an open or non-conducting state, to a closed or conducting state. For example, if the force is applied to the membrane switch that comprises the interlaced interdigital fingers of the common set of switch poles and the interdigital fingers of first set of switch poles 102, that membrane switch is activated to conduct an electrical current. If the force is then moved longitudinally along array 90, e.g., by sweeping a digit of the user longitudinally along and over successive membrane switches in the array while maintaining the force against variable resistance layer 120, each of the membrane switches is successively changed from its non-conducting state to its conducting state.

It will be apparent that the linear array of membrane switches can be used to control the value of a parameter based upon the number of membrane switches that have been successively activated, and based upon the direction in which the activation occurs. If the applied force is swept along the array in one direction, it can increase the value of the parameter, while if swept along in an opposite longitudinal direction, it can reduce the value of the parameter. Alternatively, it is also possible to selectively only activate any one of the membrane switches comprising the linear array to input a corresponding value for a parameter, based on the value associated with the membrane switch that was thus activated.

Exemplary Protective Sheet with Graphics

Figure 5:
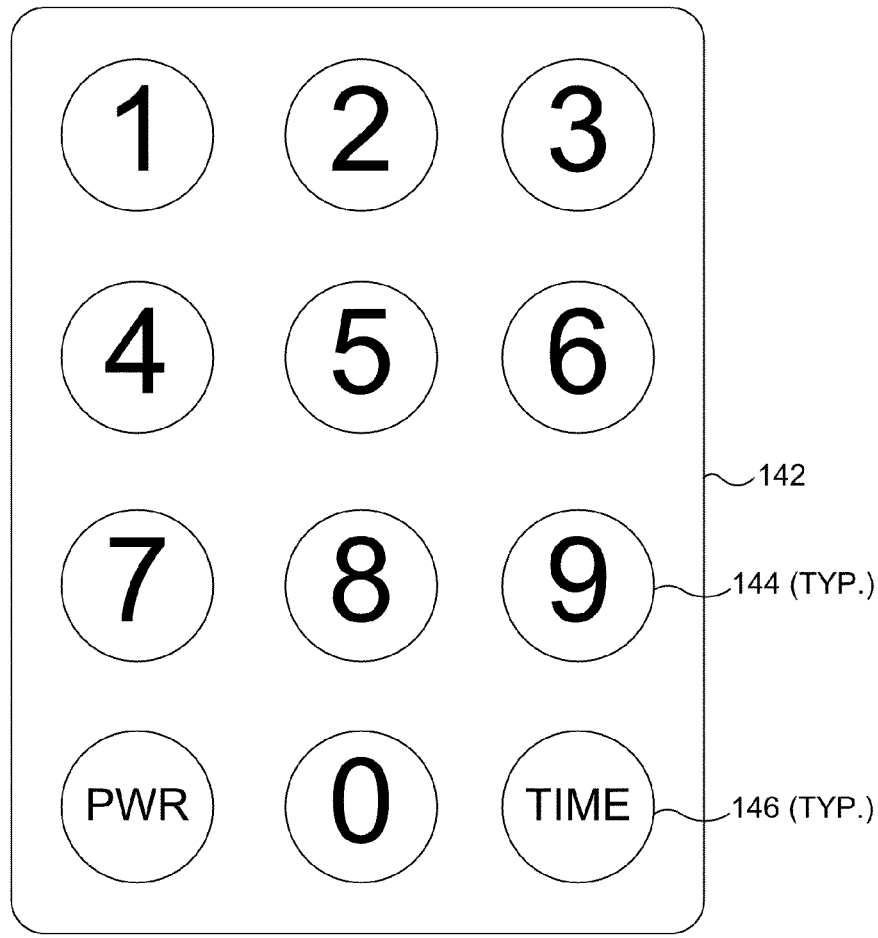
FIG. 5 is a plan view of an exemplary protective sheet, such as might be used for controlling a microwave oven, where the protective sheet includes graphics indicating the locations of membrane switches used to select numbers on a numeric keypad array, as well as indicating the location of membrane switches used for selectively activating a time mode and a power mode.

FIG. 5 illustrates an exemplary protective sheet 140 with exemplary graphics of a configuration that might be used for data entry to control a microwave oven (not shown). In this example, the protective sheet is made of relatively thin plastic, e.g., 0.5 mm. This plastic is translucent, with a solid color background around each of 12 membrane switch positions, including positions 144 that overlie membrane switches associated with the numbers 0 through 9. In addition, two positions 146 overlie membrane switches that are used to select a power setting mode and a time setting mode for data entry to control a microwave oven. The locations of each of the membrane switches are indicated by the circles that encompass the numbers/text used to indicate the functions of each membrane switch.

Figure 6:
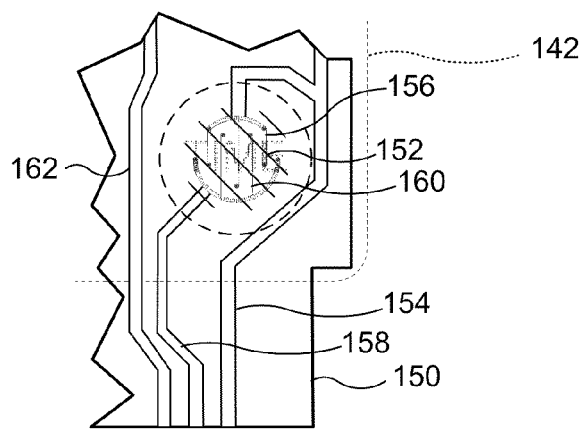
FIG. 6 is a cutaway plan view of a portion of a numeric keypad substrate that might be used with the exemplary protective sheet of FIG. 5, showing a single membrane switch configured in accord with the present approach.

As shown in FIG. 6, the right bottom portion of a substrate 150 that underlies protective sheet 142 includes a trace 154 connected to switch poles 156, and a trace 158 connected to switch poles 160. A variable resistance layer 152 is disposed between the switch poles and the protective sheet, directly in contact with the switch poles. A trace 162 is also shown in this partial cut-away view and extends to another of the membrane switches that is not shown. When a force is applied in a direction generally perpendicular to the outer surface of the variable resistance layer, the resistance of the variable resistance layer decreases substantially, enabling an electric current to flow between switch poles 156 and 160 through the variable resistance layer. Accordingly, by applying a force against the protective sheet at a position 146 designated for selection of the time setting mode for data entry, the user is selectively enabling that mode for entry of data used to control a microwave oven. It will also be understood that such a keypad protective sheet can be used for input of data used to control other types of devices, besides a microwave oven, simply by modifying the text used for positions 146, as appropriate for the device.

Clearly, many other types of functions can be indicated by appropriate graphics on protective sheets of different form, shape, and configuration, and used in other applications of the present novel membrane switches. Accordingly, the exemplary protective sheet with graphics shown in FIG. 5 is not intended to be limiting on the scope of the present approach, in any respect.

Alternative Exemplary Embodiments of Membrane Switch Array

Figure 7:
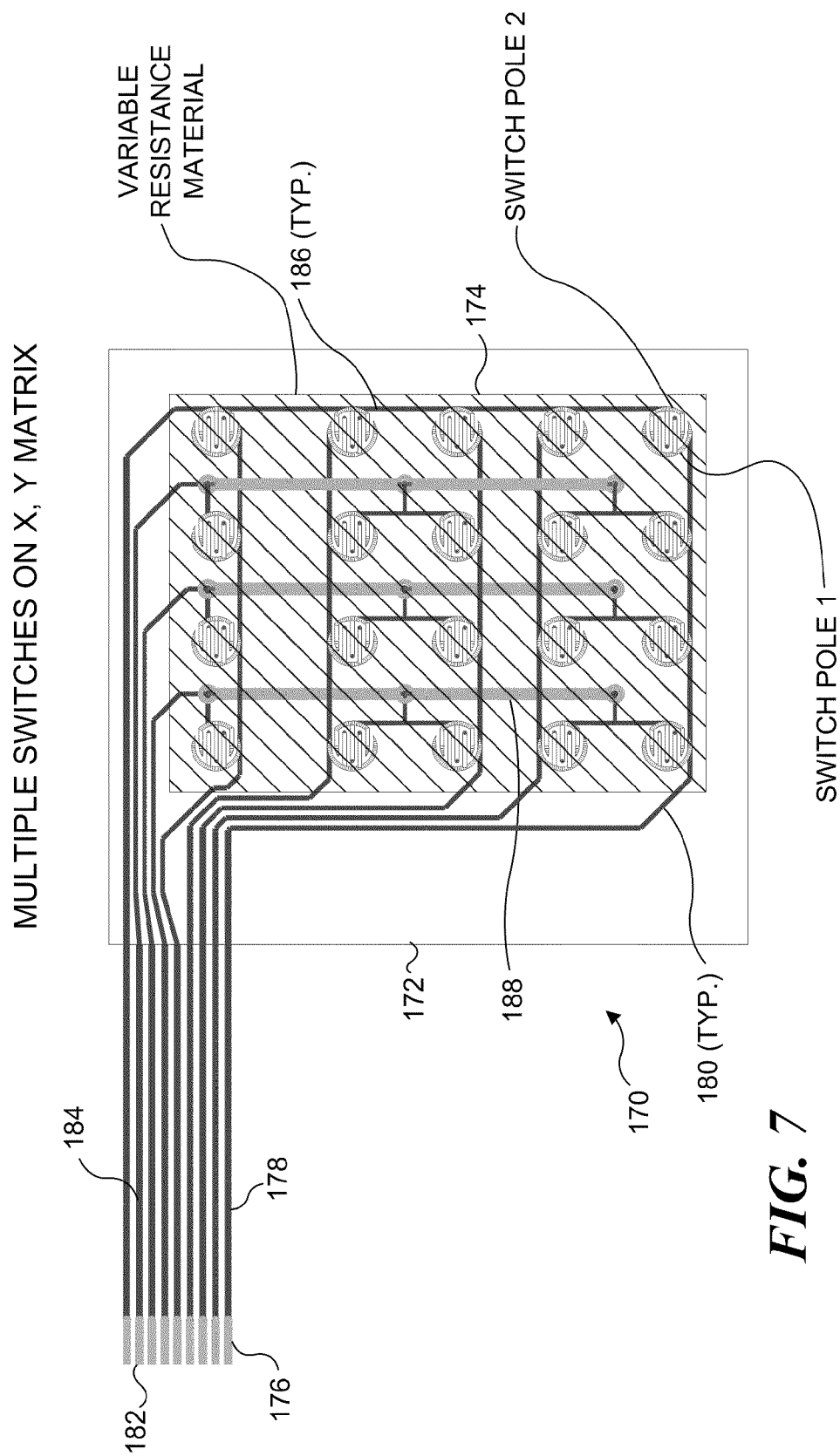
FIG. 7 is a plan view of an exemplary alternative keypad that includes a plurality of switches in an x, y array on a substrate, and having a layer of variable resistance material overlying interlinked electrodes of each switch, which can be selectively activated by applying a force to the variable resistance material where it overlies a selected switch.

FIG. 7 illustrates details of an alternative embodiment for a 3×5 membrane switch array 170 in which the membrane switches comprising each row of the array are coupled to traces that are common to the row, and the membrane switches comprising each column are coupled to traces that are common to the column. Membrane switch array 170 includes a printed circuit board substrate 172. A variable resistance layer 174 covers much of the surface of substrate 172, overlying and in direct contact with row switch poles 180 and column switch poles 186. In this embodiment, each membrane switch includes a central row switch pole 180 and four column switch poles 186, each of which is disposed at a different one of the corners of a square that is centered around the central row switch pole. Each of the terminals disposed at one end of substrate 172 is coupled either to a row or a column of the membrane switch array. For example, a terminal 176 is coupled to a conductive trace 178, which is connected to central row switch poles 180 in the bottom row of the array (as seen in FIG. 7). Similarly, a terminal 182 is coupled to a conductive trace 184, which is connected to each of the four column switch poles in the rightmost column of the array (as seen in FIG. 7). It should be noted that the conductive traces are on different layers, so that the conductive traces for one column can cross over conductive traces for different rows (as indicated by the thinning in the width of the conductive traces as seen in the Figure, where the conductive traces cross each other). An example of the crossing of two conductive traces is indicated by a reference number 188.

As is the case with each embodiment of a membrane switch made according to the present approach, application of a sufficient force against the surface of the variable resistance material reduces its resistance to electrical current flow, changing it from a non-conducting to a conducting state. The force is applied to a variable resistance layer where it overlies a membrane switch that the user wants to activate. An electric current can then readily be conveyed between the four column switch poles and the central row switch pole through variable resistance material of the membrane switch. A control (not shown) that can be coupled to the terminals at the end of substrate 172 can detect the specific membrane switch (i.e., the row and column that intersect where the membrane switch is in its conductive state) in membrane switch array 170 that has thus been actuated by a user. Accordingly, the corresponding function will be implemented for the actuated membrane switch by the control.

While not shown in FIG. 7, it will be appreciated that a suitable protective sheet can optionally be applied over membrane switch array 170, and that the position of each membrane switch in the array can be indicated by graphics on the protective sheet. Similarly, the protective sheet can include alphanumeric text or symbols that indicate the function of each membrane switch in the array. A protective sheet will typically be employed for such an array for these reasons and also, to protect the variable resistance layer from abrasion caused by a user repetitively actuating the membrane switches.

Figure 8:
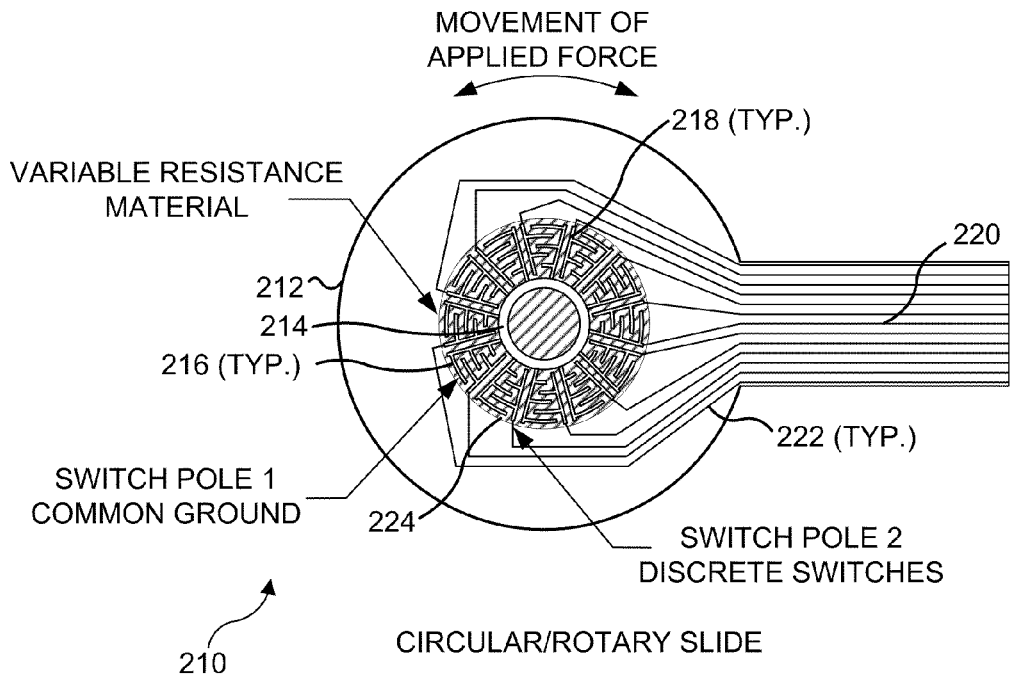
FIG. 8 is a plan view of an exemplary circular/rotary slide switch that includes variable resistance material between a plurality of radially interlinked electrodes, so that the conductivity between adjacent interlinked electrodes changes as an applied force is moved in at least a portion of a circular path over the interlinked electrodes.

FIG. 8 illustrates a circular/rotary slide switch array 210 that includes a printed circuit board substrate 212 of Fiberglass™, or paper-reinforced phenolic resin, or PET, or some other type of suitable insulating material. In this example, printed circuit board substrate 212 has a key-hole shape with a round portion where an array of switches in accord with the present novel approach are disposed, which is joined to a rectangular portion where printed circuit leads are disposed and configured to connect to external circuitry, e.g., by being coupled to a connector block (not shown) with internal contacts that match and electrically interface with the printed circuit leads. The plurality of switches are disposed radially around a center of the round portion of the key-shaped printed circuit board substrate and each switch includes a common electrode 216 having fingers interleaved or interlinked with corresponding fingers of an electrode 218. Each switch has its own electrically separate electrode 218. Common electrodes 216 are each connected on their radially inner ends to a circular common bus 214. This circular common bus is connected through one of electrodes 216 to a printed circuit lead 220 that extends along the rectangular portion of the key-hole shaped printed circuit board substrate. Similarly, separate electrode 218 of each switch is connected to a different one of printed circuit leads 222, which can be electrically coupled with external circuitry, as noted above in regard to printed circuit lead 220. Thus, one common electrode 216 and one separate electrode 218 comprise a pair of electrodes of each separate switch in the plurality of switches.

The pairs of electrodes comprising the plurality of switches are overlaid with a layer of variable resistance material 224, which changes resistance in response to a force applied to it in a direction generally normal to the layer of variable resistance material, so that the variable resistance material conducts an electrical current between the pair of electrodes comprising the switch that is disposed at the location where the force is applied. It will therefore be apparent that as the force applied in a direction normal to the layer of variable resistance material slides over the plurality of switches in a circular arc, successive switches will be activated. The external circuitry that is coupled to the plurality of switches can be configured to respond to the successive actuation of the switches in sequence, for example, by increasing or decreasing a parameter that is thus controlled by the switches, or by successively activating electronic components in sequence. As an alternative, by applying a force to a location over only one of the switches, that switch can be selectively activated, so that an external circuit or component controlled by the switch is caused to change state. Clearly, many other applications exist for circular/rotary slide switch array 210.

FIG. 8 does not illustrate a protective layer over the circular/rotary slide switch array, but it will be understood that optionally, such a layer can be provided, generally as discussed above for the other exemplary embodiments. Also, appropriate graphics and/or alphanumeric text can optionally be included on the protective layer. For example, a circular graphic can be provided that indicates where the sliding force should be applied and text can indicate the results of applying the arcuate sliding force in either or both directions over the circular/rotary slide switch array.

Exemplary Force versus Resistance Curve for Variable Resistance Layer

Figure 9:
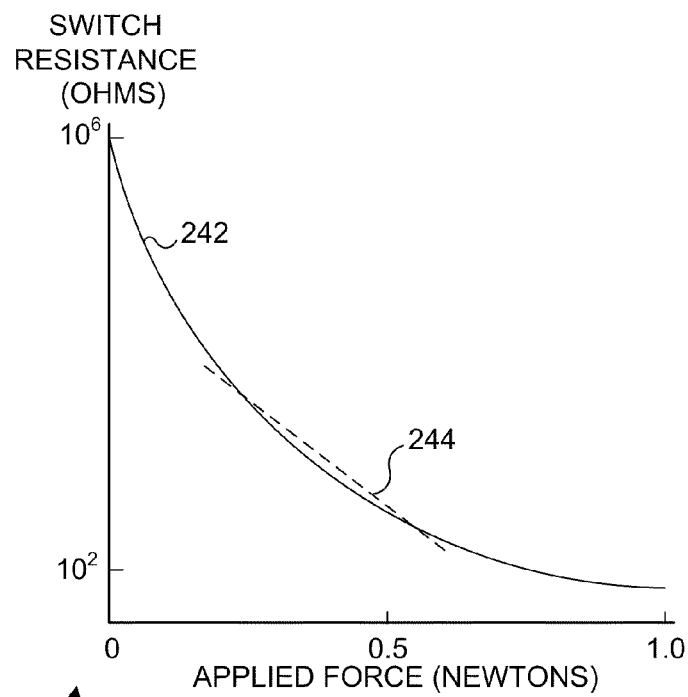
FIG. 9 is an exemplary graph of curve for resistance of a variable resistance material used in a switch as a function of the force applied and illustrating a relatively linear portion of the curve with a dash line.

An exemplary graph 240 of a nominal force versus resistance curve 242 for a material that would be suitable for use as the variable resistance layer in the membrane switches disclosed herein is illustrated in FIG. 9. The resistance of the material to electrical current flow is about 1 megohm when no force is applied to a surface of the material, but decreases to about 100 ohms as a force of about 1 Newton is applied in a direction generally normal to the surface. The characteristics of the exemplary variable resistance material shown in FIG. 9 are not intended to be limiting to the present novel approach, but are intended to illustrate the range of resistance versus force for at least one sample of such a material.

Although curve 242 is not linear in this example, a part of the curve such as the portion overlaid by dash line 244 is sufficiently linear for use in applications where it is desirable for a membrane switch to have a resistance that varies substantially linearly with the force applied, so that a user can control the resistance of the membrane by varying the force applied to the variable resistance layer. For example, if the membrane switch were coupled in series with a voltage source and a light source, the intensity of the light produced by the light source might be varied as a user varies the force applied to the material comprising the variable resistance layer of the membrane switch. In this type of application, the switch can be used like a potentiometer, rather than a typical "off-on" switch that is selectively changed only from a non-conducting to a conducting mode. Also, it is contemplated that other materials with a more linear force versus resistance relationship might be used for the variable resistance layer in such an application.

Alternative Exemplary Embodiments in which Current Flows in z Direction

An alternative exemplary embodiment of a switch 250 is illustrated in FIG. 10 in which the application of a pressure against the switch causes an electrical current to flow along a "z" axis (vertically as shown in the side view of the Figure) when the switch is activated. Switch 250 includes a non-conductive substrate 252 on which are disposed switch poles 254 and 256. The switch poles can be applied, for example, as conductive traces of copper or other conducting metal deposited on substrate 252, separated by a gap 258. As in the other embodiments discussed above, substrate 252 can be fabricated from Fiberglass™, or from paper-reinforced phenolic resin, or from polyethylene terephthalate (PET) or some other type of thermoplastic polymer resin. A layer 260 of variable resistance material like that discussed above is applied over switch poles 254 and 256. Overlying layer 260 is a layer 262 of conductive material, such as a plated metallic material or an adherently coupled conductive polymer. Optionally, although not shown in the Figure, a protective layer, which may include graphics and/or text, can be provided to overlie layer 262 of the conductive material. When a force is applied against layer 260 of the variable resistance material, for example, by someone pressing a fingertip against top conductive layer 262 (or the overlying protective layer—if used) at the position where switch poles 254 and 256 are disposed, the pressure acting on layer 260 of the variable resistance material causes it to conduct an electrical current vertically (along the z axis) from one of switch poles 254 and 256, through layer 260 of the variable resistance material, then horizontally (in the x direction) through layer 262 of the conductive material, and again vertically, but in the opposite direction, through layer 260 of the variable resistance material, to the other of the switch poles, generally as shown by connected arrows 264. Like the other exemplary embodiments, switch 250 only includes a single substrate, with each of the other components of the switch supported thereon. Also, it will be appreciated that if the switch poles are sufficiently close together, and if the force is applied over an area encompassing more than two switch poles, the force can enable electrical current to flow between more than two switch poles (not shown in the Figure).

Yet another exemplary embodiment of a switch 300 is illustrated in FIG. 11. In this embodiment, application of pressure against the switch again causes an electrical current to flow along a "z" axis (vertically as shown in the side view of the Figure) when the switch is activated. A switch pole 304 is formed as a conductive layer on a non-conductive substrate 302, for example, by printing a solid pad conductive trace of copper or other conductive metal on the substrate. Again, non-conductive substrate 302 can be fabricated from Fiberglass™, from paper-reinforced phenolic resin, from polyethylene terephthalate (PET), or some other type of thermoplastic polymer resin. A layer 310 of a variable resistance material is printed or otherwise applied directly atop switch pole 304 and is completely covering the solid pad of switch pole 304. A switch pole 306 can then be printed or otherwise applied over the layer of the variable resistance material, but printed to cover about the same area as switch pole 304. A lead 314 (or trace) of conductive metal extends from switch pole 304, along the substrate and is coupled to a controller board (not shown). Similarly, a lead 312 (or trace) of conductive metal extends from switch pole 306 along the substrate and to the controller board. The switch poles, the layer of the variable resistance material, and the leads can all be printed on the same substrate with normal printing methods or otherwise applied. The lead from switch pole 306 just "rides" down the edge of layer 310 of the variable resistance material. Since the layers are so thin, e.g., about 0.001" thick, there is no problem in printing all of the components of switch 300 in this manner.

Although the concepts disclosed herein have been described in connection with the preferred form of practicing them and modifications thereto, those of ordinary skill in the art will understand that many other modifications can be made thereto within the scope of the claims that follow. Accordingly, it is not intended that the scope of these concepts in any way be limited by the above description, but instead be determined entirely by reference to the claims that follow.

The invention in which an exclusive right is claimed is defined by the following:

1. An electrical switch comprising:
   (a) a substrate;
   (b) a plurality of electrical poles supported by the substrate; and
   (c) a layer of a variable resistance material that is directly deposited as an ink over and directly adhered to and supported by the plurality of electrical poles, an electrical resistance of the layer of the variable resistance material to electrical current flow between the plurality of electrical poles varying as a function of a force applied against the layer of the variable resistance material in a direction generally transverse to the layer.

2. The electrical switch of claim 1, wherein the electrical resistance of the layer of the variable resistance material is variable over a range sufficient to substantially block electrical current flow between the plurality of electrical poles through the layer when a force is not applied to the layer and the resistance is relatively high, and to substantially conduct an electrical current when a force is applied to the layer causing the electrical resistance to be substantially lower, so that application of the force generally changes the electrical switch from an open state, to a closed state.

3. The electrical switch of claim 1, wherein the variable resistance material is chosen so that its resistance to electrical current flow varies generally linearly over at least a defined range of force that is readily achieved by a user applying the force against the layer.

4. The electrical switch of claim 1, further comprising a layer of an electrically conductive material disposed in contact with a side of the layer of the variable resistance material opposite a side of the layer of the variable resistance material that is in contact with the plurality of electrical poles, so that when the force is applied against the layer of the variable resistance material, an electrical current flows between the plurality of electrical poles and the layer of the electrically conductive material, through the layer of the variable resistance material.

5. The electrical switch of claim 1, wherein the layer of the variable resistance material is disposed between two of the plurality of electrical poles, so that when the force is applied against an electrical pole overlying the layer of the variable resistance material, an electrical current flows between the plurality of electrical poles through the layer of the variable resistance material.

6. An electrical switch, comprising:
   (a) a substrate that comprises an electrically non-conductive material;
   (b) at least two electrical contacts supported by the substrate, so that the at least two electrical contacts are spaced-apart from each other; and
   (c) a layer of a variable resistance material deposited directly as an ink on and directly adhered to and supported by the at least two electrical contacts, a resistance of the variable resistance material to electrical current flow between the at least two electrical contacts decreasing in response to a force applied against the layer, the electrical switch being in a closed state in which an electrical current can readily flow between the at least two electrical contacts through the variable resistance material when a substantial force is applied against the layer of variable resistance material, and being in an open state in which the resistance of the layer of the variable resistance material substantially opposes an electrical current flowing between the at least two electrical contacts through the variable resistance material, when substantially no force is applied against the layer of the variable resistance material.

7. The electrical switch of claim 6, further comprising a layer of an electrically conductive material that is disposed in contact with the layer of the variable resistance material, on a side opposite that disposed in contact with the at least two electrical contacts, so that in response to the force applied against the layer of the variable resistance material, the electrical current flows from at least one of the electrical contacts, through the layer of the variable resistance material, to the layer of the electrically conducting material, transversely through the layer of the electrically conducting material, and then through the layer of the variable resistance material, to at least another of the at least two electrical contacts.

8. The electrical switch of claim 6, further comprising a protective sheet disposed over the layer of the variable resistance material, where the protective sheet is selected and configured so that a force applied to the protective sheet is readily transmitted to the layer of the variable resistance material through the protective sheet.

9. The electrical switch of claim 8, wherein the protective sheet includes graphics at least indicating a position where the force should be applied to activate the electrical switch, so as to change it from the closed state to the open state.

10. The electrical switch of claim 9, wherein at least a portion of the graphics on the protective sheet indicates a function of the electrical switch.

11. The electrical switch of claim 6, wherein the at least two electrical contacts comprise regions formed in a conductive layer that is applied to the substrate.

12. The electrical switch of claim 11, wherein the regions comprise interdigital electrodes that are interspersed and separated by gaps.

13. The electrical switch of claim 6, further comprising electrically conducting traces disposed on the substrate, the electrically conducting traces being electrically coupled to the at least two electrical contacts.

14. The electrical switch of claim 6, wherein the at least two electrical contacts comprise a plurality of electrical switch circuits, each electrical switch circuit being separately controlled to change between an open state and a closed state as a function of a force applied to a portion of the layer of the variable resistance material that is disposed in the electrical switch circuit.

15. The electrical switch of claim 14, wherein the plurality of electrical switch circuits are linearly arrayed, enabling successive electrical switch circuits to be changed from the open state, to the closed state, and back to the open state, as a location in which the force applied to the layer of the variable resistance material is moved over the plurality of electrical switch circuits, activating each electrical switch circuit in succession.

16. The electrical switch of claim 14, wherein the plurality of electrical switch circuits are configured in a circular array, so that as a location at which the force applied to the layer of the variable resistance material is slid over the plurality of electrical switch circuits, successive electrical switch circuits underlying the location are activated in succession.

17. The electrical switch of claim 14, wherein the plurality of electrical switch circuits is configured in either a one-dimensional or a two-dimensional array, so that each electrical switch circuit can be selectively activated to the closed state by applying a force to the portion of the layer of the variable resistance material that is disposed at the electrical switch circuit.

18. The electrical switch of claim 6, wherein the variable resistance material is selected to have an electrical resistance that varies from more than about 1 megohm in the open state, to less than about 100 ohms in the closed state.

19. The electrical switch of claim 6, wherein the layer of the variable resistance material is applied over the at least two electrical contacts in a desired configuration defining a specific shaped region overlying the at least two electrical contacts.

20. An electrical switch that does not require any moving parts, comprising:
    (a) a supporting substrate with conductive regions defining an electrical switch circuit, the electrical switch circuit including a plurality of electrical switch poles configured so that adjacent electrical switch poles are separated from each other and define contacts of the electrical switch; and
    (b) a variable resistance layer applied deposited as an ink directly on and directly adhered to and supported by the plurality of electrical switch poles, the variable resistance layer having a resistance characteristic, such that an electrical current flow between the adjacent electrical switch poles through the variable resistance layer is substantially impeded when no force is applied to the variable resistance layer, but is substantially enabled when a sufficient force is applied to the variable resistance layer.

21. The electrical switch of claim 20, further comprising an electrically conductive material in contact with and overlying the variable resistance layer, wherein when the force is applied to the variable resistance layer, the electrical current flows from one switch pole through the variable resistance layer, through the electrically conductive material, and then through the variable resistance layer to at least a different switch pole.

22. The electrical switch of claim 20, further comprising a protective sheet overlying the variable resistance layer, the protective sheet protecting the variable resistance layer when the electrical switch is actuated with a force applied against the protective sheet and transmitted thereby to the variable resistance layer.

23. The electrical switch of claim 22, wherein the protective sheet includes graphics that indicate at least one of:
    (a) a location where a force should be applied to enable an electrical current to flow between the electrical switch poles through the variable resistance layer; and
    (b) a function of the electrical switch.

24. The electrical switch of claim 20, further comprising electrically conductive traces that are applied to the substrate and are electrically connected to the electrical switch poles, the electrically conductive traces providing an electrical conduction path for an electrical current that will flow through the electrical switch when sufficient force is applied to the variable resistance layer to enable the current flow between adjacent electrical switch poles through the variable resistance layer.

25. The electrical switch of claim 20, wherein the variable resistance layer is fabricated of a material that is selected to have a relatively high resistance, sufficient to substantially impede electrical current flow when the variable resistance layer is not subjected to an applied force, but to have a relatively low resistance, sufficient to substantially conduct electrical current flow when the variable resistance layer is subjected to an applied force.

\* \* \* \* \*